(12) United States Patent
Stoeldraijer et al.

(10) Patent No.: US 8,896,809 B2
(45) Date of Patent: Nov. 25, 2014

(54) LITHOGRAPHIC APPARATUS AND DEVICE MANUFACTURING METHOD

(75) Inventors: Judocus Marie Dominicus Stoeldraijer, Bladel (NL); Erik Roelof Loopstra, Heeze (NL); Jan Bernard Plechelmus Van Schoot, Eindhoven (NL); Diederik Jan Maas, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 916 days.

(21) Appl. No.: 11/889,722

(22) Filed: Aug. 15, 2007

(65) Prior Publication Data
US 2009/0047604 A1    Feb. 19, 2009

(51) Int. Cl.
*G03B 27/42*    (2006.01)
*G03F 7/20*    (2006.01)

(52) U.S. Cl.
CPC .......... *G03F 7/7045* (2013.01); *G03F 7/70466* (2013.01); *G03F 7/70425* (2013.01); *G03F 7/70733* (2013.01); *G03F 7/70991* (2013.01)
USPC .................................. 355/53; 355/30; 355/72

(58) Field of Classification Search
CPC .............. G03F 7/7075; G03F 7/70716; G03F 7/70825; G03F 7/70466; G03F 7/70758; G03F 9/7088; G03F 9/7096; G03F 7/2028; G03F 7/70366; G03F 7/70458
USPC ................................................ 355/30, 53, 67
See application file for complete search history.

(56) References Cited

U.S. PATENT DOCUMENTS

| | | | |
|---|---|---|---|
| 6,894,762 B1 | 5/2005 | Berman | |
| 7,023,530 B1 * | 4/2006 | Berman et al. | 355/77 |
| 7,063,920 B2 | 6/2006 | Baba-Ali | |
| 2004/0168632 A1 * | 9/2004 | Ito et al. | 118/715 |
| 2004/0229130 A1 | 11/2004 | Baba-Ali | |
| 2005/0018157 A1 * | 1/2005 | Box et al. | 355/30 |
| 2005/0088633 A1 | 4/2005 | Borodovsky | |
| 2006/0012766 A1 * | 1/2006 | Klosner et al. | 355/67 |
| 2006/0055905 A1 * | 3/2006 | Baselmans et al. | 355/67 |
| 2006/0132733 A1 * | 6/2006 | Modderman | 355/53 |

(Continued)

FOREIGN PATENT DOCUMENTS

| | | |
|---|---|---|
| JP | 10-135105 | 5/1998 |
| JP | 2001-237167 A | 8/2001 |

(Continued)

OTHER PUBLICATIONS

Translation document for WO2004053951 A1.*

(Continued)

*Primary Examiner* — Mesfin T Asfaw
(74) *Attorney, Agent, or Firm* — Pillsbury Winthrop Shaw Pittman LLP

(57) ABSTRACT

A lithographic apparatus and method is disclosed to reduce the exposure time that a substrate spends within a main lithographic apparatus by pre- (or post-) exposing one or more edge devices on the substrate. Because an edge device does not ultimately yield a useful device, it can be exposed with a lithographic apparatus that has a lower resolution than that used to expose one or more of the other, complete devices produced from the substrate. Therefore, the pre- (or post-) exposure of an edge device can be performed using a less complex, and less expensive, lithographic device.

21 Claims, 6 Drawing Sheets

(56) References Cited

U.S. PATENT DOCUMENTS

| | | |
|---|---|---|
| 2006/0139591 A1 | 6/2006 | Jung |
| 2006/0170896 A1* | 8/2006 | Markoya et al. ............... 355/67 |
| 2006/0244032 A1 | 11/2006 | Park |
| 2007/0172767 A1 | 7/2007 | Nagasaka |
| 2008/0204685 A1 | 8/2008 | Kono et al. |

FOREIGN PATENT DOCUMENTS

| | | |
|---|---|---|
| JP | 2002-164280 A | 6/2002 |
| JP | 2004-343127 | 12/2004 |
| JP | 2005-26649 A | 1/2005 |
| JP | 2005-202311 | 7/2005 |
| JP | 2008-210877 A | 9/2008 |
| TW | 200622506 | 7/2006 |
| TW | 200720622 | 6/2007 |
| WO | 2004/053951 | 6/2004 |

OTHER PUBLICATIONS

Chinese Office Action for Chinese Application No. 200810145952.7 dated Jan. 15, 2010.
Singapore Office Action for Singapore Application No. 200805864-6 dated Aug. 12, 2009.
Office Action in related Chinese patent application No. 200810145952.7 mailed Sep. 27, 2010.
Office action in related Japanese application No. JP2008-205399 mailed Apr. 13, 2011.
Taiwan Office Action dated Nov. 8, 2012 in corresponding Taiwan Patent Application No. 097130414.
Japanese Office Action mailed Aug. 30, 2012 in corresponding Japanese Patent Application No. 2008-205399.

* cited by examiner

LITHOGRAPHIC APPARATUS AND DEVICE MANUFACTURING METHOD

FIELD

The present invention relates to a lithographic apparatus and a method for manufacturing a device using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several devices) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Following exposure of the substrate and subsequent processing steps (such as etching), one or more devices are typically produced on the substrate. Such devices may be referred to as "dies". These devices can subsequently be used in the manufacture of, for example, ICs. The one or more devices are substantially square or rectangular in shape, but the substrate itself is typically substantially circular in shape. Thus, one or more incomplete devices (hereinafter referred to as an edge device) are formed around the perimeter of a substantially circular substrate (or around the periphery of a non-circular substrate). A target portion may include only an edge device, a target portion may contain both an edge device and a complete device, and a target portion may contain only a complete device. No useful device can be created from an edge device, and thus this portion of the substrate is wasted.

Nevertheless, it is still desirable to expose target portions that contain an edge device in order to, for example, enhance the uniformity of subsequent processing steps (such as etching and chemical-mechanical polishing (CMP)) over the substrate and to reduce and/or homogenize out-of-field stray radiation effects. Thus, exposing the edge area of the substrate can enhance, for example, the total yield of complete devices produced from the substrate by ensuring that fewer of them are defective, but it also significantly reduces throughput.

SUMMARY

It is desirable, for example, to increase throughput of substrates.

According to an aspect of the invention, there is provided a lithographic apparatus, comprising:

a first lithographic device arranged to project a first pattern onto a substrate; and a second lithographic device arranged to project a second pattern onto the substrate, wherein the first lithographic device and the second lithographic device are contained within the same housing.

According to an aspect of the invention, there is provided a dual stage lithographic apparatus, comprising:

an exposure station comprising a first lithographic device arranged to expose a substrate; and a measurement station comprising a second lithographic device arranged to expose a substrate, the second lithographic device comprising a programmable mirror array, and comprising a measurement device configured to perform measurements on a substrate.

According to an aspect of the invention, there is provided a device manufacturing method comprising:

exposing a target portion of a substrate that is contained wholly within a periphery of the substrate using a first lithographic device, but not exposing a target portion that intersects the periphery of the substrate using the first lithographic device; and exposing a target portion of a substrate that is not exposed by the first lithographic device using a second lithographic device, wherein the exposing using the first lithographic device exposes a target portion on the same resist layer as the exposing using the second lithographic device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
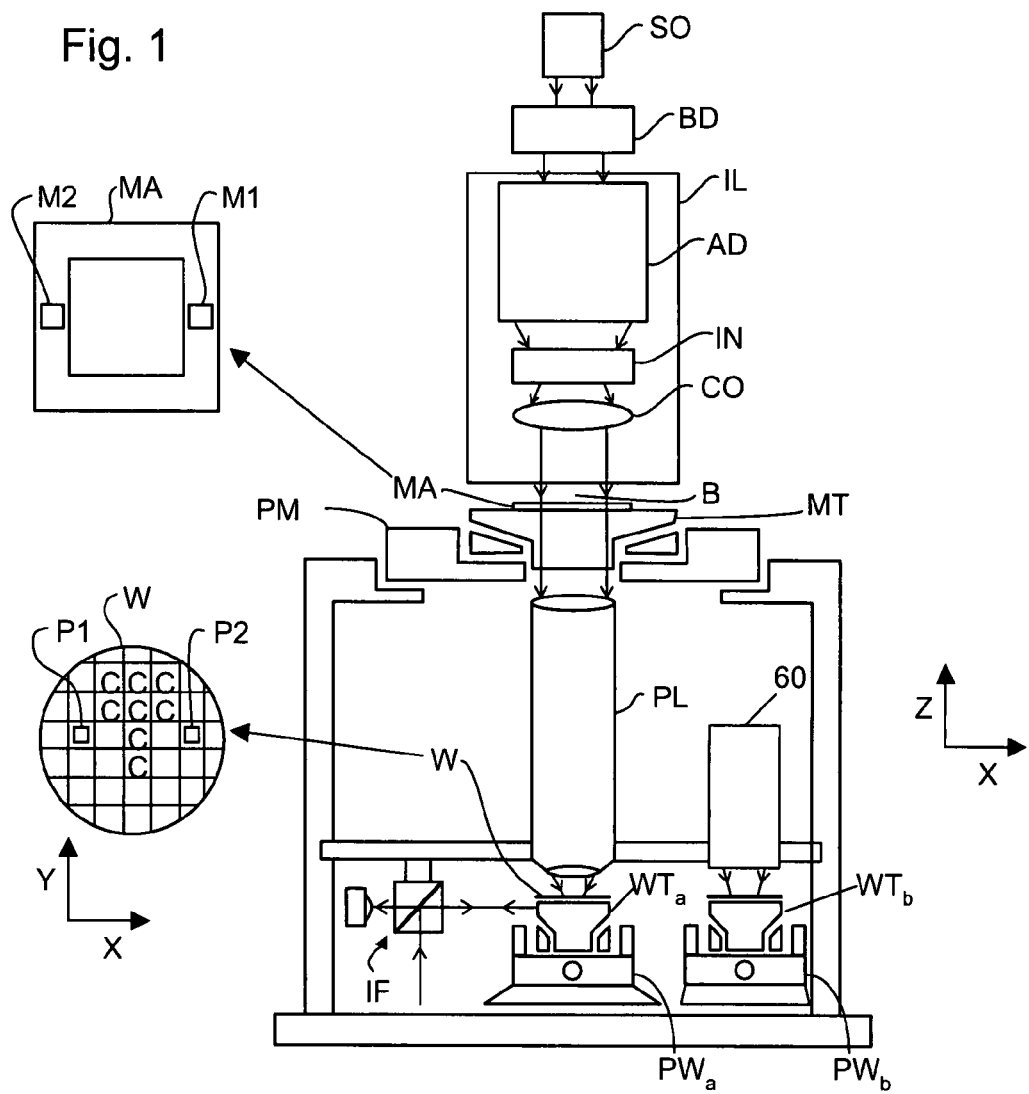
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) $WT_a$ constructed to hold a substrate (e.g. a resist-coated wafer) W and connected to a second positioner $PW_a$ configured to accurately position the substrate in accordance with certain parameters; and a projection system (e.g. a refractive projection lens system) PL configured to project a pattern imparted to the radiation beam B by patterning device MA onto a target portion C (e.g. comprising one or more devices) of the substrate W.

The apparatus further comprises a second exposure device 60 which is further described below.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner $PW_a$ and position sensor IF (e.g. an interferometric device, linear encoder or capacitive sensor), the substrate table $WT_a$ can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table $WT_a$ may be realized using a long-stroke module and a short-stroke module, which form part of the second positioner $PW_a$. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one device is provided on the patterning device MA, the patterning device alignment marks may be located between the devices.

The depicted apparatus could be used in at least one of the following modes:

1. In step mode, the support structure MT and the substrate table $WT_a$ are kept essentially stationary, while an entire pattern imparted to the radiation beam is projected onto a target portion C at one time (i.e. a single static exposure). The substrate table $WT_a$ is then shifted in the X and/or Y direction so that a different target portion C can be exposed. In step mode, the maximum size of the exposure field limits the size of the target portion C imaged in a single static exposure.

2. In scan mode, the support structure MT and the substrate table $WT_a$ are scanned synchronously while a pattern imparted to the radiation beam is projected onto a target portion C (i.e. a single dynamic exposure). The velocity and direction of the substrate table $WT_a$ relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table $WT_a$ is moved or scanned while a pattern imparted to the radiation beam is projected onto a target portion C. In this mode, generally a pulsed radiation source is employed and the programmable patterning device is updated as required after each movement of the substrate table $WT_a$ or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
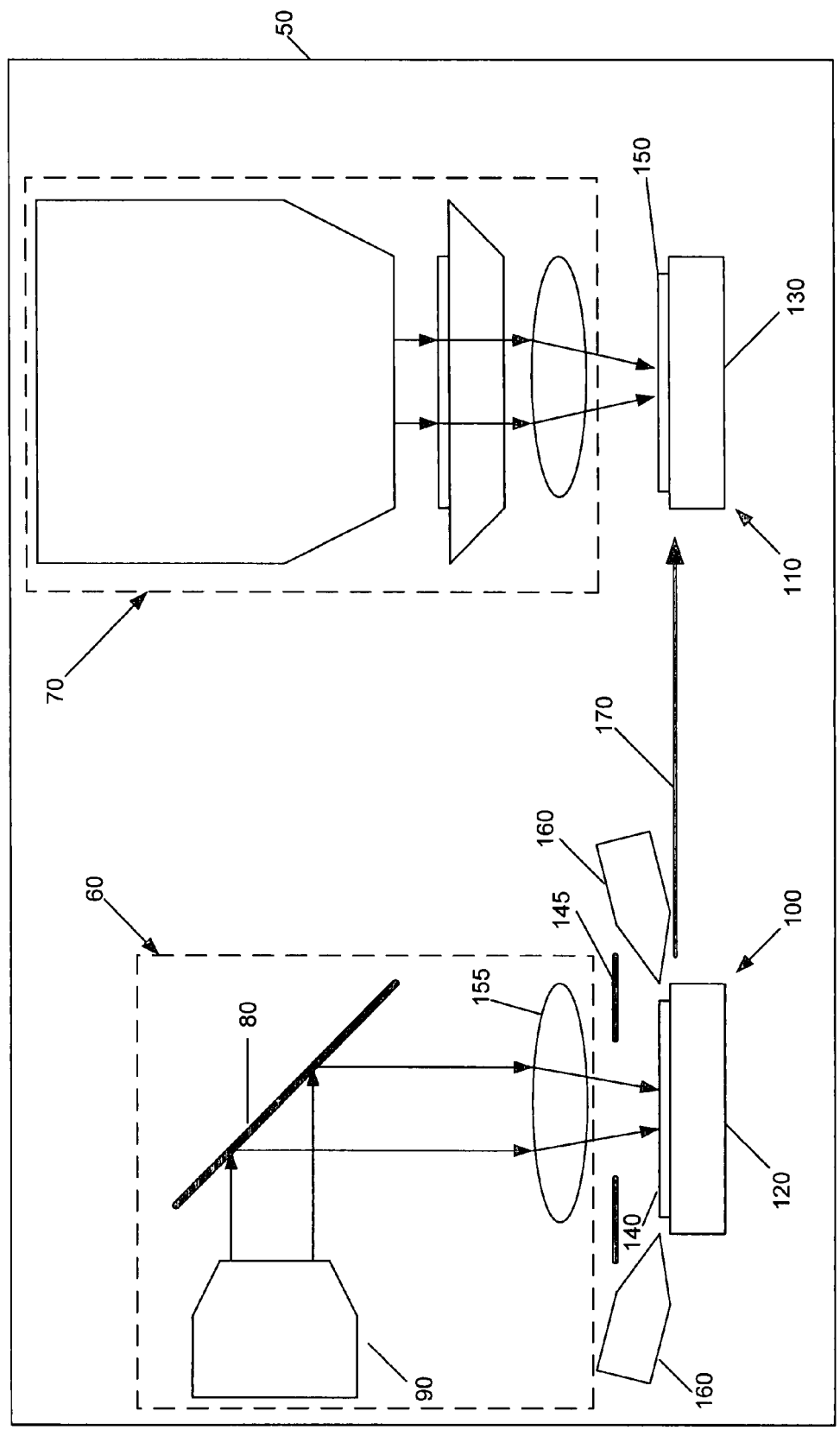
FIG. 4 depicts a schematic of a lithographic apparatus according to an embodiment of the invention.

According to an embodiment of the present invention, two separate lithographic devices are used to impart patterns onto the substrate 10, as shown in FIG. 4. One lithographic device 60 is used to expose (at least primarily) one or more edge devices, and the other lithographic device 70 is used to expose (at least primarily) one or more of the rest of the devices on the substrate (i.e., one or more complete devices).

Figure 2:
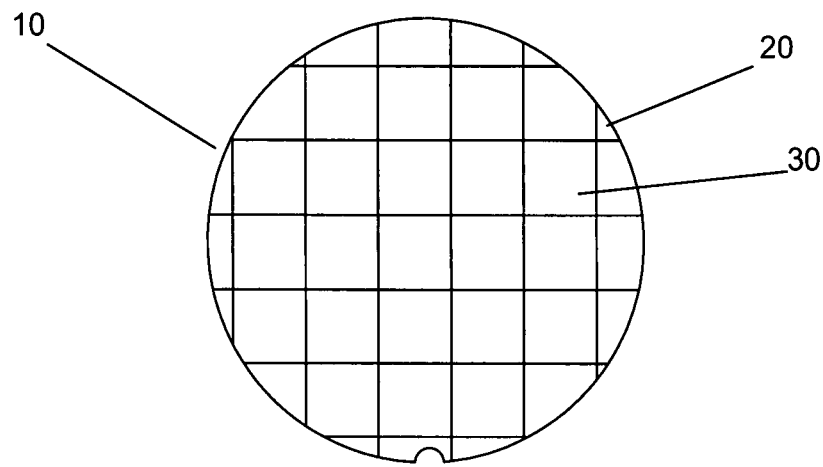
FIG. 2 depicts a substrate before exposure, but with the devices indicated.
Figure 3:
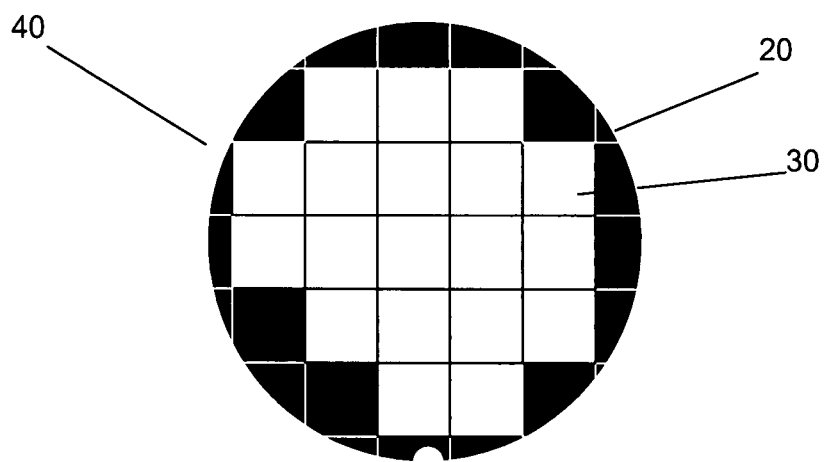
FIG. 3 depicts a substrate after exposure of a plurality of edge devices.

An edge device refers to a part of the substrate which, when exposed, does not result in a complete device, and is therefore ultimately not used. For example, because a substrate is typically substantially circular in shape, whereas the complete device is substantially square or rectangular, one or more incomplete devices (or edge devices) are formed around the perimeter of a circular substrate. This can be seen in FIG. 2, in which the substrate 10 has edge devices 20 and complete devices 30. In FIG. 3, the edge devices 20 are shown as shaded and the complete devices 30 are left unshaded.

Although the edge device 20 cannot ultimately be used (for example in the manufacture of integrated circuits (ICs)) because it is not a complete device 30, it still is exposed so as to ensure that other processes that are performed on the substrate 10 (including that part of the substrate that yields a complete device) are uniform, or approximately uniform. This is so that other processes that are performed on the substrate 10 are not adversely affected in a manner that would render one or more of the complete devices unusable. Such other processes include, for example, etching and chemical-mechanical polishing.

Exposure of an edge device is also used to decrease the out-of-field stray radiation non-uniformity experienced by the substrate 10 when a complete device 30 is exposed. This can also affect the uniformity and/or accuracy of the complete device 30 that is formed on the substrate 10. Control of the out-of-field stray radiation may be of particular importance in an embodiment that uses extreme ultraviolet (EUV) radiation.

Any phenomenon (such as those described above) that could adversely affect a complete device on the substrate 10 could potentially reduce, for example, the total yield of one or more useful devices produced from a given substrate 10. Thus, it is desirable to control these phenomena by appropriately exposing one or more edge devices 20.

While edge device exposure is desirable for the reasons set out above, it is not necessary for the exposure to be as accurate as that required for exposure of a complete device 30 on the substrate 10, because ultimately an edge device 20 is not used to make a useful device. The edge device 20 should be exposed with an accuracy sufficient to ensure that the quality of a complete device 30 is not adversely affected. Thus, the accuracy, or resolution, of the pattern used to expose the edge device 20 need not be as high as that used to expose the other, complete, device 30. Therefore, in an embodiment, the lithographic device 60 used to expose one or more edge devices 20 results in a pattern that has a lower resolution than that used in exposing the one or more complete devices 30. Thus, the lithographic device 60 used to expose an edge device can be of a lower quality (for example, it could have a lower numerical aperture) than the lithographic device 70 used to expose a complete device, and/or can be of a lower cost.

In an embodiment, an edge device 20 is exposed before one or more of the other devices 30 on the substrate 10 (i.e., the one or more edge devices are pre-exposed). Desirably, all of the edge device(s) 20 are exposed before any of the one or more other devices 30 are exposed, although in an embodiment one or more other, complete devices 30 may be exposed before a final edge device 20 has been exposed. It is advantageous, for the out-of-field stray radiation properties of exposure of a complete device 30, for one or more of the edge devices 20 to be exposed before the complete device is exposed. This may be of particular importance when using extreme ultraviolet (EUV) to expose a non edge-device 30 because of the increased stray radiation levels involved with EUV, which can be up to, for example, 5-15%. Exposing an edge device 20 before a complete device 30 may also or alternatively provide an advantage of minimizing the time between exposure of the complete device 30 and the next processing step (which could be, for example, a baking step). However, in an embodiment, one or more of the edge devices 20 can be exposed using the edge device lithographic device 60 after one or more non-edge devices have been exposed (i.e. the one or more edge devices are post-exposed).

In an embodiment, it may be that more than one device is exposed for each target portion of the lithographic device 70 used to expose a complete device. Thus, the lithographic device 70 used to expose a complete device could expose one or more edge devices, as well as one or more complete devices in a single target portion. The lithographic device 60 used to expose an edge device may also expose one or more complete devices. Therefore, in an embodiment, one or more edge devices 20 may be exposed by the lithographic device 70 used to expose a complete device. This could be the case if, for example, a single target portion exposed by the lithographic device 70 used to expose a complete device exposed more than one device, such that, towards the edge of the substrate, the target portion included one or more complete devices 30, as well as one or more edge devices 20.

Desirably, part or all of the pattern used to expose part or all of an edge device 20 is the same as or similar to part or all of the pattern used to expose part or all of an other, complete device 30 on the substrate. A number of factors could be considered to be significant in ensuring the pattern used to expose the edge device 20 is similar to the pattern used to expose the other, complete, device 30. For example ensuring that the "filling factor" (that is, the density, or proportion, of the device that is exposed), and/or the shape of the pattern itself, and/or the lateral aspect ratio of the features of the pattern are the same or similar could be significant parameters. Desirably, shape features on the complete device 30 with a dimension of 100 μm should be replicated to some extent on the edge device 20. More desirably, shape features on the complete device 30 with a dimension of 5 μm to 10 μm should be replicated to some extent on the edge device 20. Thus, while the edge device 20 can be exposed at a lower resolution than the complete device 30, the pattern used to expose them is chosen such that the exposed edge device 20 behaves similarly to the complete device 30 (for example, in the effect that it has on a neighboring, complete device) during all processing steps (such as etching and chemical-mechanical polishing (CMP)).

In an embodiment, a maskless lithographic device 60 is used to expose an edge device 20. An advantage of using a maskless lithographic device 60 is that it can be readily re-programmed to adjust the pattern with which the edge device 20 is exposed. This means that a new mask (or reticle) is not required to match changes in the design of a complete device 30.

An example of a maskless lithographic device 60 that could be used to expose an edge device 20 is a digital micromirror device (DMD) 80. The DMD 80 is used to impart a pattern on the radiation supplied by the radiation source 90.

Typically such a DMD 80 would contain one to ten million actuators. With such a device, a pattern resolution of approximately 5-30 μm can be achieved. In an embodiment, a resolution of better than 5 μm may be possible, and in an embodiment, a pattern resolution of worse than 30 μm may be sufficient. The specification of the lithographic device 60 can be chosen to achieve the desired pattern resolution for sufficiently enhancing the uniformity of other processes (such as etching, and chemical-mechanical polishing), as discussed above. In a typical embodiment, the DMD 80 would contain approximately two million mirrors, and the pattern resolution would be approximately 15-20 μm.

In an embodiment, a masking system 145 (such as a masking blade system) is provided for use with the lithographic device 60 to expose an edge device 20 to prevent any complete device 30 from being exposed during edge device exposure. Desirably, the masking system 145 is located between the substrate 140 and the lens 155, which lens receives the radiation from the patterning device 80. This allows the lens 155 to be of a lower quality (and thus be less expensive) than if the masking system 145 were placed between the patterning device 80 and the lens 155. Alternatively or additionally, masking system 145 could be placed between the patterning device 80 and the lens 155. Alternatively or additionally, the masking system 145 could be located between the radiation source 90 and the patterning device 80. Any of the embodiments described herein may or may not employ a masking system 145.

Figure 5:
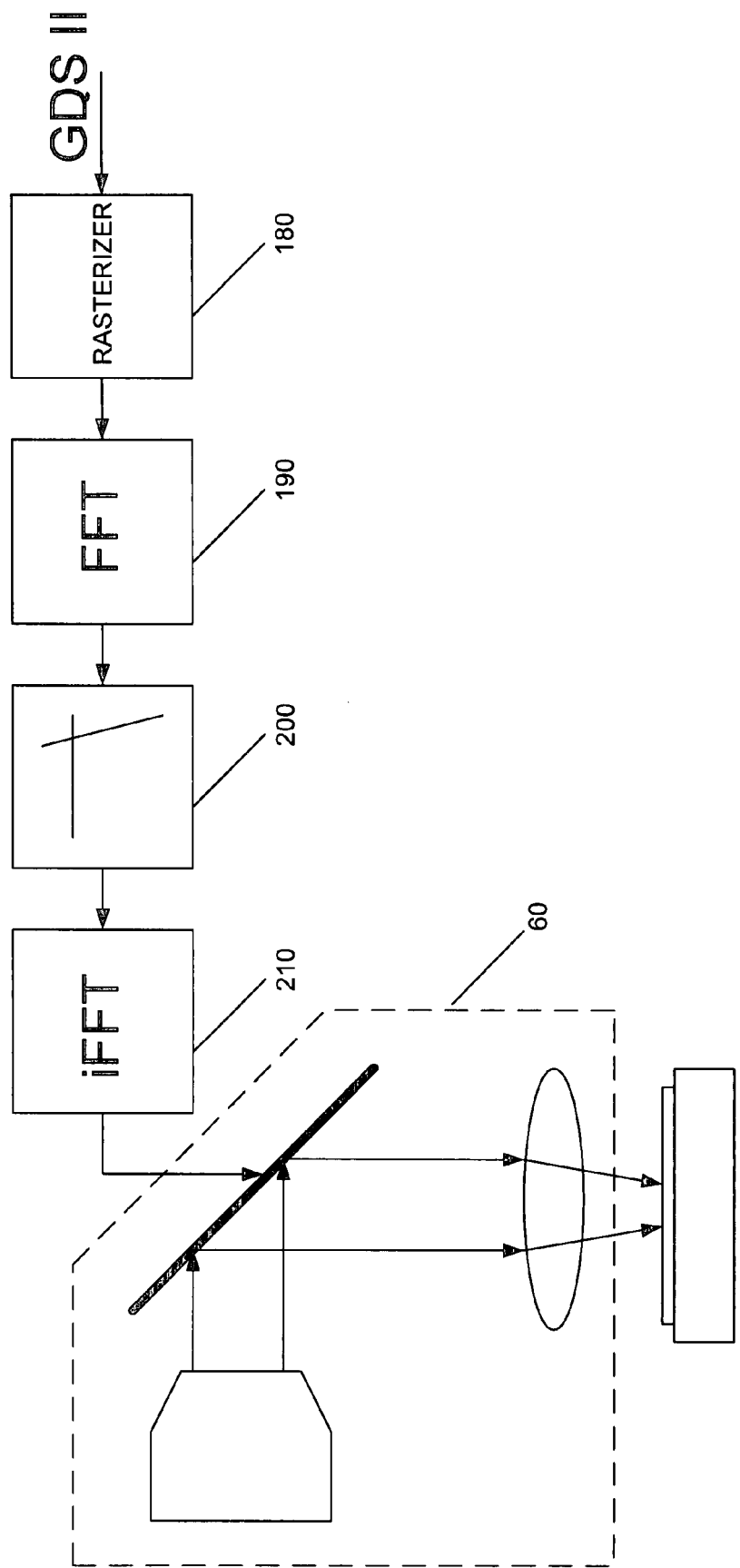
FIG. 5 depicts a method and an apparatus to prepare the data to be used in exposing an edge device and to use that data to expose the edge device.

FIG. 5 shows how the DMD 80 can be programmed with data to project the required pattern onto the substrate. In the embodiment shown in FIG. 5, the input to the process is a GDS II file which is a file that contains data that would normally be used to produce a mask (or reticle). In an embodiment, any file type that contains information about the pattern to be imparted onto the radiation beam could be used, such as an OASIS file.

In the first stage 180, the GDS II (or equivalent) data is converted into a bitmap format. This step is performed before the data is input to the DMD 80, and any suitable technique could be used to convert the data into bitmap format, for example a rasterizer could be used. Next, in the illustrated embodiment, a Fast Fourier Transform (FFT) 190 is performed on the rasterized GDS II data. A low-pass filter 200 is then used to remove some of the data. This is possible because the original GDS II file contains all of the data that would normally be used to produce a mask to expose patterns for a complete device 30 on the substrate 10. However, as discussed above, because the resolution required for an edge device 20 is not as great as that needed for a complete device 30, not all of the original GDS II file data is required for an edge device 20, and so a low-pass filter can be used to reduce the file size. The next step is to perform an inverse Fast Fourier Transform (iFFT) 210. The output from the iFFT is then passed directly to the lithographic device 60 to expose an edge device 20, which in the embodiment of FIG. 4 comprises a DMD 80. As shown in FIG. 5, this data is used to control the DMD 80 such that the desired exposure pattern is imparted onto the radiation beam, and subsequently used to expose an edge device.

Using the method and apparatus described above, there is no requirement to use the GDS II file to produce a mask for the lithographic device 60 to expose an edge device 20, thus reducing process time and cost.

In an embodiment in which a DMD 80 is used in the exposure of an edge device 20, any other suitable processing steps could be used to convert the original file containing information about the pattern to be imparted onto the radiation beam (such as a GDS II file) into data that is used to control the DMD 80 (a "DMD excitation pattern"). Thus, any step or steps that result in the information about the pattern to be imparted onto the radiation beam being suitably mapped (for example at the desired resolution) onto the pixels of the DMD 80 could be employed. Furthermore, the DMD 80 can be programmed so as to impart any pattern that results in the edge device 20 being exposed with a pattern that is suitably similar (as discussed herein) to the pattern used to expose a complete device 30 onto the radiation beam. In an embodiment, this need not necessarily originate from data that would normally be used to produce a mask (or reticle) for complete dies, but could be any suitable pattern.

In an embodiment, the pre-processing steps performed on the GDS II data (i.e. the rasterizing, the FFT, low pass filtering, and iFFT) are performed "offline" i.e. before the substrate 10 itself enters the lithographic device 60 used to expose the edge device. Alternatively or additionally, the pre-processing steps performed on the GDS II data could be performed at any other time before the edge device 20 is exposed by the lithographic device 60 used to expose the edge device, or during exposure of the edge device 20.

In an embodiment, the lithographic device 60 used to expose the edge device comprises a DMD 80 used in a stepper mode. Alternatively or additionally, the lithographic device 60 used to expose the edge device could be used in a scanner mode, or in any other suitable mode, such as those discussed above.

While an embodiment described above comprises a programmable DMD 80 to impart a pattern onto the beam, an embodiment could use a radiation source with any other programmable device that could be used to impart the desired pattern onto the exposing radiation.

In an embodiment, a conventional lithographic device using a mask, or reticle, such as that shown in detail in FIG. 1, could be used to expose an edge device 20. The mask may contain a "dummy" pattern containing lines and/or dots. Using such a mask, the pattern with which the edge device 20 is exposed (which is related to the pattern which is imparted onto the beam using the mask) can be adjusted by changing the intensity of the radiation incident on the mask. By employing such a system, a single mask can be used in the exposure of several different edge device patterns.

Figure 7:
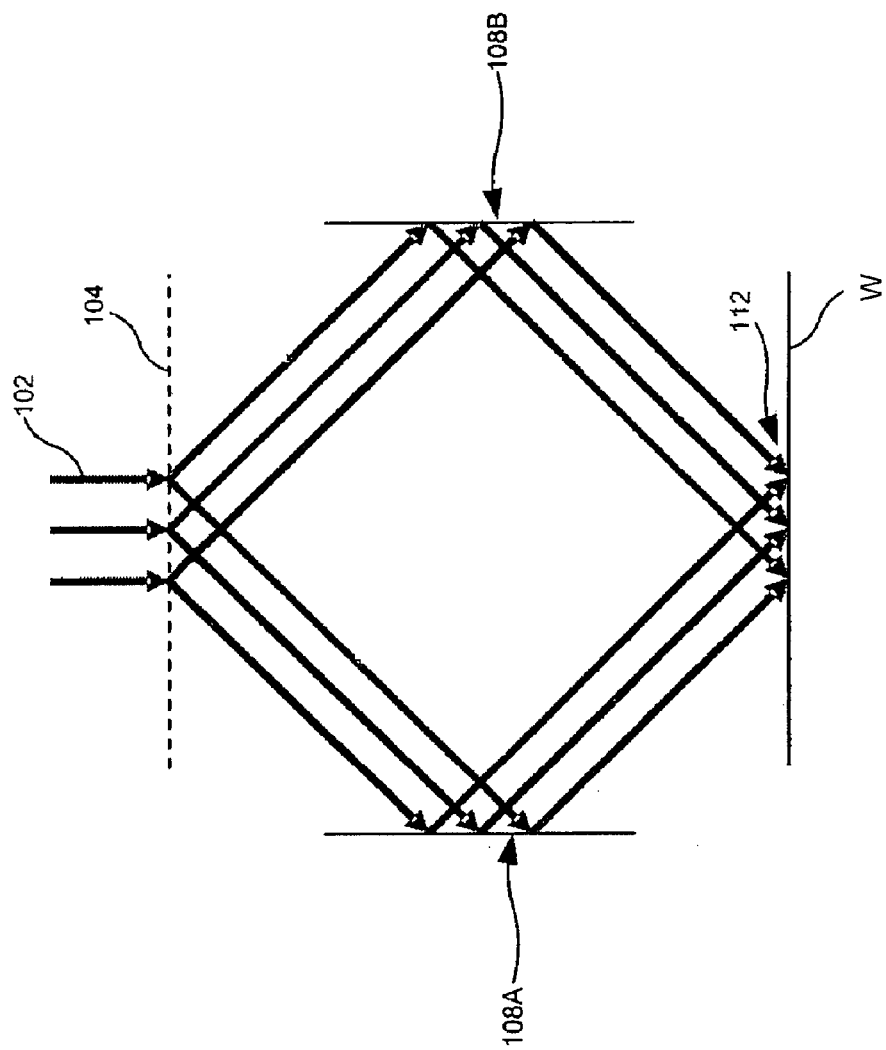
FIG. 7 depicts an interference system for a lithographic apparatus according to an embodiment of the invention.

In an embodiment, an interference system could be used to create an edge device pattern. In this system, referring to FIG. 7, a grating 104 can be used to split the radiation beam. The (monochromatic) radiation beam 102 can be split into, for example, two, or four, beams. The beams can then be directed onto the substrate using one or more mirrors 108*a*, 108*b* such that they interfere with each other to create a line pattern 112 (in the case of two interfering beams), or a checkerboard pattern 112 (in the case of four interfering beams). A zero order stop may be used in this embodiment to prevent the zero order radiation reaching the substrate. The interference of the beams can be controlled (for example, using the mirror(s)) so as to adjust the pattern with which the edge device 20 is exposed.

Any conventional type of lithographic device could be used to expose a complete device 30 on the substrate. The choice of lithographic device used to expose a complete device 30 is not necessarily related to the choice of lithographic device used to expose the edge device 20, and vice versa.

In an embodiment, the lithographic device 60 to expose an edge device 20 is housed within the same lithographic apparatus 50 as the lithographic device 70 used to expose a complete device 30. In an embodiment, the lithographic apparatus 50 housing the lithographic device 60 to expose an edge device and the lithographic device 70 to expose a complete device is a dual-stage machine, having two stations (100, 110), and two substrate tables 120, 130, as shown in FIG. 4.

The two substrate tables 120, 130 are used to support two substrates 140, 150. As is conventional for such a dual-stage machine, preparatory steps (such as measurement, surface mapping, and alignment steps) are carried out using a measurement device 160 at one station 100, before the substrate 140 is passed onto the lithographic device 70 used to expose a complete device 30 at the other station 110.

In an embodiment, a dual-stage machine 50 is used and is arranged such that the lithographic device 60 to expose an edge device 20 is located at one station 100. This means that the edge device 20 can be exposed on a substrate 140 at one station 100 during the time that preparatory steps are being carried out on that substrate 140 at the same station 100. In this way, at the same time that a complete device 30 is being exposed on one substrate 150 at the one station 110, preparatory steps are being performed, and an edge device 20 is being exposed, on a substrate 140 at the other station 100. Having had its one or more edge devices 20 exposed, the substrate 140 (together with its substrate table) is then transferred from the first station 100 to the second station 110 where exposure of a complete device 30 takes place. Any conventional transfer device 170, such as a rotating arm or a controller used to control a motor of the substrate tables 120, 130, could be used to transfer the substrates 140, 150 between stations 100, 110.

Alternatively, the preparatory steps and/or the edge device exposure could occur on different substrate tables and/or at different times.

In an embodiment, the lithographic apparatus 50 could be a multi-stage machine having more than two stations and/or more than two substrate tables. For example, one embodiment could comprise a multi-stage lithographic machine in which preparatory steps (such as measurement, surface mapping, and alignment steps) are carried out using a measurement device at one station, the lithographic device 60 to expose an edge device is located at another station, and the lithographic device 70 to expose the complete device is at still another station. In such an embodiment, the substrate 140 can be moved between each station in any order, so long as the preparatory steps are carried out before the substrate 140 is transferred to the lithographic device 70 to expose the complete device.

In an embodiment, the lithographic device 60 to expose an edge device could be in a physically separate location from the lithographic device 70 to expose a complete device.

In an embodiment, which could be incorporated into a dual- (or multi-) stage machine, the two lithographic devices 60, 70 could be arranged such that a complete device 30 is exposed first by the lithographic device 70 to expose a complete device, and an edge device 20 is exposed using the lithographic device 60 to expose an edge device after the complete device 30 has been exposed.

In an embodiment, the substrate 40 appears, for example, as shown in FIG. 3 when leaving the lithographic device 60 used to expose an edge device. In FIG. 3, the shaded areas show edge devices 20 that have been exposed by the lithographic device 60 used to expose an edge device, and the unshaded areas show devices 30 which have not yet been exposed, but which will be exposed using the lithographic device 70 used to expose a complete device 30.

Figure 6:
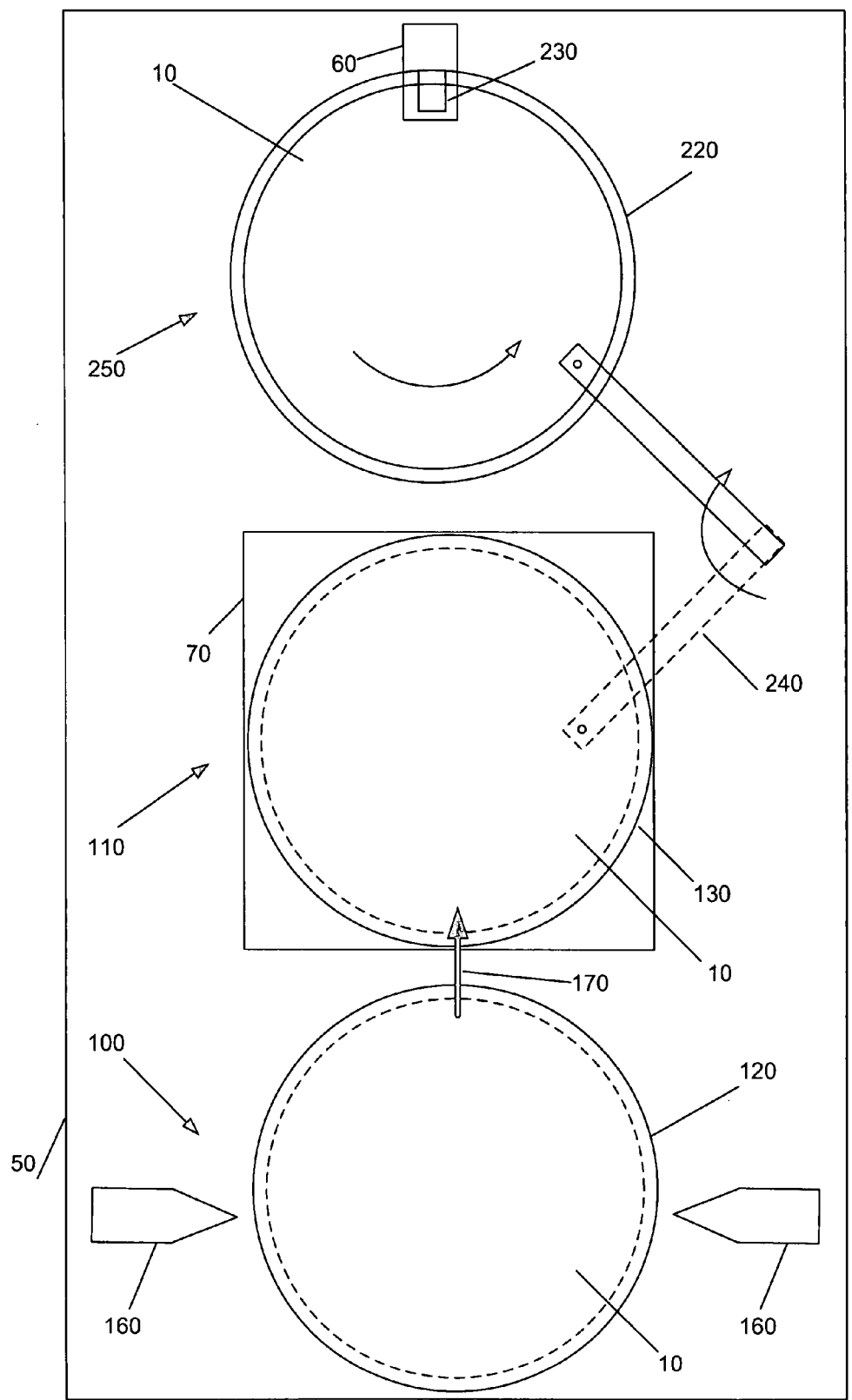
FIG. 6 depicts a lithographic apparatus according to an embodiment of the invention.

In an embodiment, the lithographic device 60 used to expose an edge device could be used in conjunction with a substrate table 220 which rotates the substrate 10, as shown in FIG. 6. In an example of this embodiment, rotation of the substrate 10 is achieved by rotating the entire substrate table 220. In this embodiment, three substrate tables may be provided such that at any given time, one is located at the measurement station 100 of a dual- (or multi-) stage machine, one is located at the exposure station 110 for exposure using the lithographic device 70 to expose a complete device, and the other is a rotatable table located at a station 250 to expose an edge device using the lithographic device 60 to expose an edge device.

A robot 240 can be used to transfer the substrate to and from the rotatable substrate table 220. In the embodiment shown in FIG. 6, the substrate is transferred from the substrate table 130 (used during exposure of a complete device 30) to the rotatable substrate table 220. In an embodiment, the substrate 10 could be transferred to the rotatable substrate table 220 from a substrate table 120 used at the measurement stage of a dual- (or multi-) stage machine. In an embodiment, after exposure of an edge device 20, the substrate 10 could be transferred (using the same robot 240, or a different robot) from the rotatable substrate table 220 to the substrate table 130 used for measurement and then exposure of a complete device 30.

This embodiment comprising a substrate table 220 which can rotate the substrate 10 for exposure of an edge device takes advantage of the fact that an edge device is located around the periphery of the substrate, and thus that there can be no (or limited) requirement for the table to be able to translate the substrate in the X-Y plane. Any desirable sliding or lateral movement of the substrate in X-Y plane could be achieved, for example, by translating the beam from the lithographic device 60 and/or moving the substrate table 220 using a small-stroke sliding table on which the substrate table 220 rests. Thus, the substrate table 220 used to support the substrate during edge device exposure can be simpler and less expensive than a conventional substrate table.

The exposing part 230 of the lithographic device 60 to expose an edge device is located above the periphery of the substrate 10 so as to only expose an edge area of the substrate 10 as the substrate table 220 rotates. Control of the rotational positioning of the substrate table 220 that can rotate the substrate 10 could be achieved by using a cylindrical encoder grid and Z, R and Phi sensors.

In an embodiment comprising a substrate table 220 which can rotate the substrate 10, the numerical aperture of the projection system could be on the order of 0.2, and the illumination field could be approximately 26 mm×33 mm. Using a radiation source with a typical wavelength, a pattern resolution of 1 µm should be achievable, which is normally sufficient for edge device exposure.

In an embodiment comprising a substrate table 220 which can rotate the substrate 10, a mask may be used to impart a pattern on the radiation beam. The mask could contain a "dummy" pattern comprising line patterns and/or dot patterns. The edge device pattern could then be adjusted (for example, the density of the pattern could be adjusted) as required to suit the pattern on a complete device by adjusting the intensity of the radiation source, as described above. In an embodiment comprising a substrate table 220 which can rotate the substrate 10, a DMD 80 could be used to create the pattern for exposing an edge device 20, as described above. In an embodiment, an interference system (such as that described above) could be used to create the pattern for exposing an edge device 20.

In an embodiment, the lithographic device 60 to expose an edge device may rotate in addition to or alternatively to the substrate table 220. Similarly, in an embodiment using a mask with a "dummy" pattern, the assembly holding the mask may rotate. Any masking device 145 that is used may rotate.

By implementing an embodiment of the invention described above, the time that the substrate spends on the more expensive lithographic device 70 to expose a complete device can be significantly reduced, thus increasing productivity. For example, in the substrate shown in FIG. 3, the total number of devices exposed by the lithographic device used to expose a complete device is reduced from 41 to 19 by pre-(or post-) exposing the edge devices. This results in a 54 percent reduction in the exposure time required of the lithographic device 70 used to expose a complete device, even though the same number of useful devices is ultimately produced.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the term "wafer" herein may be considered as synonymous with the more general term "substrate". The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a first lithographic device arranged to project a first pattern onto a substrate to expose a target portion of a resist layer of the substrate that is contained wholly within a periphery of the substrate, but not to expose a target portion that intersects the periphery of the substrate, the first lithographic device being configured to project the first pattern with a first resolution and including a first substrate table configured to hold the substrate during exposure of the substrate with the first pattern; and
a second lithographic device arranged to project a second pattern onto the substrate to expose a target portion of the substrate that is not exposed by the first lithographic device, the second lithographic device being configured to project the second pattern with a second resolution, the second resolution being lower than the first resolution, and including a second substrate table configured to hold the substrate during exposure of the substrate with the second pattern, wherein the first lithographic device exposes a same resist layer of the substrate as the second lithographic device, wherein the second substrate table is configured to rotate about an axis that is substantially normal to the plane of the substrate to expose multiple target positions of the substrate that are not exposed by the first lithographic device, and wherein the second substrate table is movable relative to the second lithographic device so that only an edge of the substrate held by the second substrate table is positionable under an exposure part of the second lithographic device.

2. The apparatus of claim 1, wherein the second lithographic device comprises an interference system configured to impart the second pattern onto a radiation beam, the interference system comprising:
a grating configured to split the radiation beam into at least two radiation beams; and
a mirror configured to direct the at least two radiation beams, such that the at least two beams interfere at the substrate.

3. The apparatus of claim 1, wherein the first lithographic device comprises a mask configured to impart the first pattern onto a radiation beam.

4. The apparatus of claim 1, wherein the second pattern:
has the same pattern as, or a similar pattern to, the first pattern; and/or
has shape features with an aspect ratio that is the same as, or similar to, the aspect ratio of corresponding shape features of the first pattern; and/or
results in the same, or a similar, proportion of each target portion or device being exposed with radiation as that proportion of each target portion or device exposed as a result of the first pattern.

5. The apparatus of claim 1, comprising:
an exposure station at which the first lithographic device is located;
a measurement station at which the second lithographic device is located; and
a measurement device, located at the measurement station, configured to make a measurement on the substrate.

6. The apparatus of claim 5 wherein:
the first substrate table is configured to hold the first substrate; and
the second substrate table is configured to hold the second substrate;
the apparatus comprising a transfer device configured to cause transfer of the first and second substrate tables respectively from the measurement station to the exposure station.

7. The apparatus of claim 1, wherein the first and second lithographic devices are configured to expose respective first and second substrates simultaneously.

8. The apparatus of claim 1, wherein the first lithographic device and the second lithographic device are contained within the same housing.

9. The apparatus of claim 1, wherein the second lithographic device is used to expose an area of the substrate which, if exposed by the first lithographic device, would be part of a target portion which extends beyond the edge of the substrate.

10. The apparatus of claim 1, wherein no development of the substrate is performed between exposure by the first lithographic device and the second lithographic device.

11. The apparatus of claim 1, configured to expose the substrate using the second lithographic device before exposure of the substrate using the first lithographic device.

12. The apparatus of claim 1, configured to expose the substrate using the second lithographic device after exposure of the substrate using the first lithographic device.

13. The apparatus of claim 1, wherein the first lithographic device comprises a first projection system, and the second lithographic device comprises a second projection system, the second projection system having a lower numerical aperture than the first projection system.

14. A lithographic apparatus, comprising:
a first lithographic device arranged to project a first pattern onto a substrate to expose a target portion of a resist layer of the substrate that is contained wholly within a periphery of the substrate, but not to expose a target portion that intersects the periphery of the substrate, the first lithographic device being configured to project the first pattern with a first resolution and including a first substrate table configured to hold the substrate during exposure of the substrate with the first pattern; and
a second lithographic device arranged to project a second pattern onto the substrate to expose a target portion of the substrate that is not exposed by the first lithographic device, the second lithographic device being configured to project the second pattern with a second resolution, the second resolution being lower than the first resolution, and including a second substrate table configured to hold the substrate during exposure of the substrate with the second pattern, wherein the first lithographic device exposes a same resist layer of the substrate as the second lithographic device, wherein the second lithographic device comprises a programmable patterning device configured to impart the second pattern onto a radiation beam, and wherein the second substrate table is movable relative to the second lithographic device so that only an edge of the substrate held by the second substrate table is positionable under an exposure part of the second lithographic device.

15. The apparatus of claim 14, wherein the programmable patterning device comprises an array of individually controllable elements forming a programmable mirror array.

16. A dual stage lithographic apparatus, comprising:
an exposure station comprising a first lithographic device arranged to expose a target portion of a resist layer of a substrate that is contained wholly within a periphery of the substrate, but not to expose a target portion that intersects the periphery of the substrate, the first lithographic device being configured to expose said target portion with a first resolution and including a first substrate table configured to hold the substrate during exposure of said target portion of the substrate; and
a measurement station comprising a second lithographic device arranged to expose a target portion of the substrate that is not exposed by the first lithographic device, the second lithographic device being configured to expose said target portion not exposed by the first lithographic device with a second resolution, the second resolution being lower than the first resolution, and including a second substrate table configured to hold the substrate during exposure of said target portion not exposed by the first lithographic device, wherein the first lithographic device exposes a same resist layer of the substrate as the second lithographic device and the second lithographic device comprises a programmable mirror array, and comprising a measurement device configured to perform measurements on a substrate, wherein the measurement station includes a third substrate table configured to hold the substrate during measurements of the substrate, and wherein the second substrate table is movable relative to the second lithographic device so that only an edge of the substrate held by the second substrate table is positionable under an exposure part of the second lithographic device.

17. The apparatus of claim 16, wherein no development of the substrate is performed between exposure by the first lithographic device and the second lithographic device.

18. The apparatus of claim 16, configured to expose the substrate using the second lithographic device before exposure of the substrate using the first lithographic device.

19. The apparatus of claim 16, configured to expose the substrate using the second lithographic device after exposure of the substrate using the first lithographic device.

20. The apparatus of claim 16, wherein:
- the first substrate table is configured to hold a first substrate; and
- the second substrate table is configured to hold a second substrate;
- the apparatus comprising a transfer device configured to cause transfer of the first and second substrate tables respectively from the measurement station to the exposure station.

21. The apparatus of claim 13, wherein:
- the first lithographic device comprises a first projection system, and
- the second lithographic device comprises a second projection system, the second projection system having a lower numerical aperture than the first projection system.

\* \* \* \* \*